(12) United States Patent
Yoo et al.

(10) Patent No.: US 11,490,514 B2
(45) Date of Patent: Nov. 1, 2022

(54) ELECTRONIC DEVICE

(71) Applicant: Samsung Display Co., LTD., Yongin-si (KR)

(72) Inventors: Bugyoon Yoo, Hwaseong-si (KR); Yunjae Kim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/189,872

(22) Filed: Mar. 2, 2021

(65) Prior Publication Data

US 2021/0368621 A1 Nov. 25, 2021

(30) Foreign Application Priority Data

May 21, 2020 (KR) .................. 10-2020-0061002

(51) Int. Cl.
*G06F 1/16* (2006.01)
*H05K 1/11* (2006.01)
*G09F 9/30* (2006.01)
*H05K 1/14* (2006.01)

(52) U.S. Cl.
CPC .......... *H05K 1/118* (2013.01); *G06F 1/1652* (2013.01); *G09F 9/301* (2013.01); *H05K 1/147* (2013.01); *H05K 2201/10128* (2013.01)

(58) Field of Classification Search
CPC ............ H05K 1/118; H05K 1/147; H05K 2201/10128; G06F 1/1652; G09F 9/301
USPC ....................................................... 361/749
See application file for complete search history.

(56) References Cited

U.S. PATENT DOCUMENTS

| | | | |
|---|---|---|---|
| 9,716,111 B2* | 7/2017 | Son | ............... G02F 1/13452 |
| 10,555,426 B2 | 2/2020 | Ahn et al. | |
| 2010/0073616 A1 | 3/2010 | Abe et al. | |
| 2013/0229591 A1 | 9/2013 | Kong | |
| 2015/0255022 A1 | 9/2015 | Son et al. | |
| 2017/0099736 A1* | 4/2017 | Jung | ............... H05K 7/20963 |
| 2019/0131248 A1* | 5/2019 | Kong | ............... G06K 19/06009 |

FOREIGN PATENT DOCUMENTS

| | | |
|---|---|---|
| KR | 10-2017-0055431 | 5/2017 |
| KR | 10-2018-0079554 | 7/2018 |
| KR | 10-2019-0006151 | 1/2019 |
| KR | 10-2019-0139441 | 12/2019 |
| KR | 10-2020-0016027 | 2/2020 |

OTHER PUBLICATIONS

Extended European search report for European Patent Application or Patent No. 21174568.2 dated Oct. 18, 2021.

* cited by examiner

*Primary Examiner* — Binh B Tran
(74) *Attorney, Agent, or Firm* — Kile Park Reed & Houtteman PLLC

(57) ABSTRACT

An electronic device may include a display panel, a plate disposed under the display panel and including a code area in which a unique code is disposed, and a circuit film electrically connected to the display panel. The circuit film includes a first portion, and a second portion extending from the first portion and covering the code area.

19 Claims, 13 Drawing Sheets

ELECTRONIC DEVICE

CROSS-REFERENCE TO RELATED APPLICATION(S)

This application claims priority to and benefits of Korean Patent Application No. 10-2020-0061002 under 35 U.S.C. § 119, filed in the Korean Intellectual Property Office on May 21, 2020, the entire contents of which are incorporated herein by reference.

BACKGROUND

1. Technical Field

The disclosure relates to an electronic device with improved reliability.

2. Description of the Related Art

An electronic device may include a display panel. In a process of manufacturing the display panel, a unique code may be provided to the display panel to manage the display panel. The unique code may be provided in the form of a bar code or a quick response (QR) code. The unique code may be provided directly to the display panel or may be provided to another component adhered to the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure may provide an electronic device capable of reducing the possibility of occurrence of electrical noise.

The disclosure may also provide an electronic device capable of improving durability on impact.

In an embodiment of the disclosure, an electronic device may include a display panel, a plate disposed under the display panel and including a code area in which a unique code may be disposed, and a circuit film electrically connected to the display panel. The circuit film may include a first portion, and a second portion extending from the first portion and covering the code area.

In an embodiment, the electronic device may further include a plurality of lower layers disposed on a bottom surface of the plate and exposing the code area.

In an embodiment, a thickness of the second portion of the circuit film may be equal to or less than a thickness of the plurality of lower layers.

In an embodiment, a portion of the second portion may be surrounded by the plurality of lower layers.

In an embodiment, a thickness of the first portion of the circuit film may be greater than a thickness of the second portion.

In an embodiment, the display panel includes a first area, a second area and a third area. The first area, the second area, and the third area may be disposed along a first direction.

The second area may be foldable along a folding axis extending in a second direction intersecting the first direction. An opening may be defined in a portion of the plate, which faces the second area.

In an embodiment, the electronic device may further include a cover layer disposed on a bottom surface of the plate and covering the opening, a plurality of lower plates disposed on a bottom surface of the cover layer and spaced apart from each other in the first direction, a plurality of heat dissipation sheets disposed on bottom surfaces of the plurality of lower plates, respectively, and a plurality of insulating films disposed on bottom surfaces of the plurality of heat dissipation sheets, respectively.

In an embodiment, a thickness of the second portion of the circuit film may be equal to or less than a height from the bottom surface of the plate to a bottom surface of each of the plurality of insulating films.

In an embodiment, the code area may be disposed under the third area, and the circuit film may be disposed in a peripheral area of the display panel, the peripheral area being adjacent to the third area.

In an embodiment, the electronic device may further include a conductive tape disposed between the first portion and the plate.

In an embodiment, the conductive tape may extend between the second portion of the circuit film and the plate.

In an embodiment, the electronic device may further include an adhesive layer disposed between the second portion of the circuit film and the plate.

In an embodiment, the plate may include at least one of a metal and a metal alloy, and the second portion of the circuit film may include an insulating material.

In an embodiment, the second portion of the circuit film may extend from the first portion in a first direction, and a width of the second portion in a second direction intersecting the first direction may be less than a width of the first portion in the second direction.

In an embodiment of the disclosure, an electronic device may include a display panel, a plate disposed under the display panel and having a bottom surface on which a unique code may be disposed, and a circuit film electrically connected to the display panel and disposed on the bottom surface of the plate. The circuit film may include a first portion having a first thickness, and a second portion having a second thickness less than the first thickness.

In an embodiment, the second portion of the circuit film may cover an area of the plate, and the unique code may be disposed in the area of the plate.

In an embodiment, the electronic device may further include a plurality of lower layers disposed on the bottom surface of the plate and not overlapping the circuit film. The plurality of lower layers may protrude from the bottom surface of the plate to a same level or a level lower than a bottom surface of the second portion of the circuit film.

In an embodiment, the plate may include at least one of a metal and a metal alloy, and the second portion of the circuit film may include an insulating material.

In an embodiment of the disclosure, an electronic device may include a display panel, a plate disposed under the display panel and including a bottom surface, and a top surface disposed between the bottom surface and the display panel, the bottom surface including a first area in which a unique code may be disposed, and a second area adjacent to the first area. The electronic device may include an insulating film disposed under the second area of the plate, and a circuit film including a first portion disposed in the second area of the plate, and a second portion covering the first area.

In an embodiment, a distance between the bottom surface of the plate and a bottommost surface of the insulating film may be equal to or greater than a distance between the bottom surface of the plate and a bottom surface of the second portion of the circuit film.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
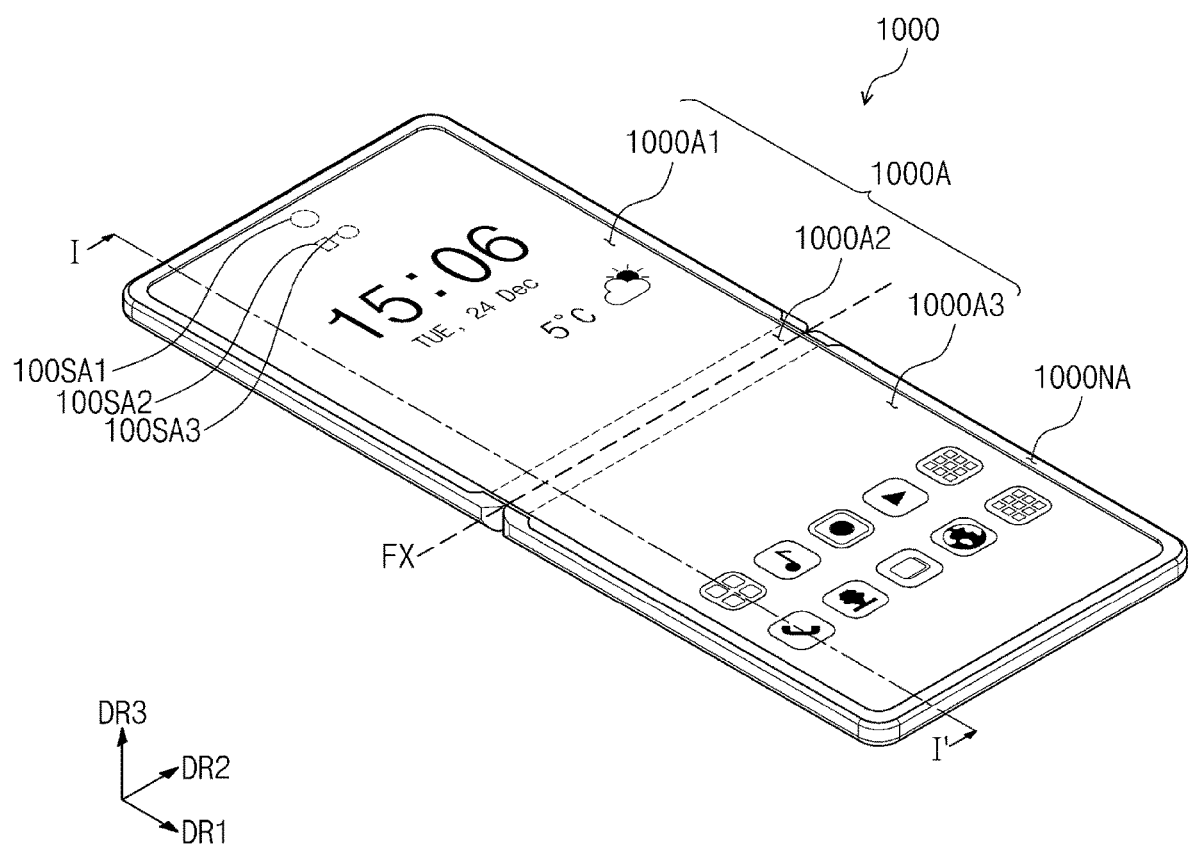
FIG. 1A is a schematic perspective view illustrating an electronic device according to an embodiment of the disclosure.

Description will now be made more fully hereinafter with reference to the accompanying drawings, in which various embodiments are shown. Concepts of the disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be understood that when an element such as a layer, region or substrate is referred to as being "on" another element, it can be directly on the other element or intervening elements may be present. In contrast, the term "directly" means that there may be no intervening elements.

It will be further understood that terms such as "comprises" and/or "comprising," "has" and/or "having", or "includes" and/or "including" specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that may be idealized illustrations. In the drawings, the thicknesses of layers and regions may be exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes may not be intended to illustrate the actual shape of a region of a device and are not intended to limit the scope of embodiments.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

The phrase "at least one of is intended to include the meaning of" at least one selected from the group of for the purpose of its meaning and interpretation. For example, "at least one of A and B" may be understood to mean "A, B, or A and B."

Figure 1B:
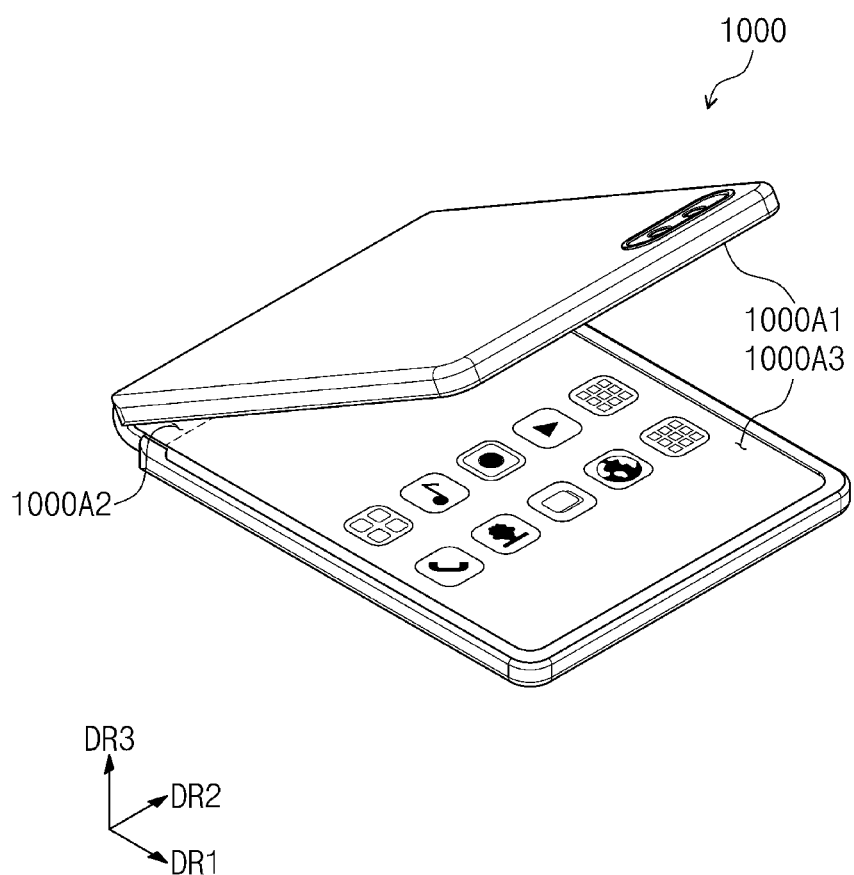
FIG. 1B is a schematic perspective view illustrating an electronic device according to an embodiment of the disclosure.

FIG. 1A is a schematic perspective view illustrating an electronic device according to an embodiment of the disclosure. FIG. 1B is a schematic perspective view illustrating an electronic device according to an embodiment of the disclosure. FIG. 1A illustrates a state in which an electronic device 1000 is unfolded, and FIG. 1B illustrates a state in which the electronic device 1000 is folded.

Referring to FIGS. 1A and 1B, the electronic device 1000 may be activated by an electrical signal. For example, the electronic device 1000 may be, but is not limited to, a portable phone, a tablet, a car navigation device, a game console, or a wearable device. A portable phone is illustrated as an example of the electronic device 1000 in FIG. 1A.

The electronic device 1000 may display an image through an active area 1000A. In the state in which the electronic device 1000 may be unfolded, the active area 1000A may include a plane defined by a first direction DR1 and a second direction DR2. A thickness direction of the electronic device 1000 may be parallel to a third direction DR3 intersecting the first and second directions DR1 and DR2. Thus, a front surface (or a top surface) and a rear surface (or a bottom surface) of each of the components constituting the electronic device 1000 may be defined based on the third direction DR3.

The active area 1000A may include a first area 1000A1, a second area 1000A2, and a third area 1000A3. The second area 1000A2 may be bendable along a folding axis FX extending in the second direction DR2. Thus, the first area 1000A1 and the third area 1000A3 may be referred to as non-folding areas, and the second area 1000A2 may be referred to as a folding area.

In case that the electronic device 1000 may be folded, the first area 1000A1 and the third area 1000A3 may face each other. Thus, the active area 1000A may not be exposed to the outside in a completely folded state, and this operation may be referred to as an in-folding operation. However, the operation of the electronic device 1000 is not limited thereto.

In a certain embodiment, in case that the electronic device 1000 may be folded, the first area 1000A1 and the third area 1000A3 may be opposite to each other. Thus, the active area 1000A may be exposed to the outside in the folded state, and this operation may be referred to as an out-folding operation.

The electronic device 1000 may perform only one of the in-folding operation and the out-folding operation. In other embodiments, the electronic device 1000 may perform both the in-folding operation and the out-folding operation. The same area (e.g., the second area 1000A2) of the electronic device 1000 may be in-foldable and out-foldable. In other embodiments, a partial area of the electronic device 1000 may be in-foldable, and another partial area of the electronic device 1000 may be out-foldable.

A single folding area and two non-folding areas are illustrated as an example in FIGS. 1A and 1B. However, the number of folding areas and non-folding areas are not limited thereto. In a certain embodiment, the electronic device 1000 may include three or more non-folding areas, and multiple folding areas, each of which may be disposed between the non-folding areas adjacent to each other.

A case in which the folding axis FX may be parallel to a short axis of the electronic device 1000 is illustrated as an example in FIGS. 1A and 1B. However, embodiments of the disclosure are not limited thereto. In a certain embodiment, the folding axis FX may extend parallel to a long axis of the electronic device 1000, for example, the first direction DR1. The first area 1000A1, the second area 1000A2 and the third area 1000A3 may be sequentially arranged in the second direction DR2.

Multiple sensing areas 100SA1, 100SA2 and 100SA3 may be defined in the electronic device 1000. Three sensing areas 100SA1, 100SA2 and 100SA3 are illustrated as an example in FIG. 1A. However, the number of sensing areas 100SA1, 100SA2 and 100SA3 is not limited thereto.

The multiple sensing areas 100SA1, 100SA2 and 100SA3 may include a first sensing area 100SA1, a second sensing area 100SA2, and a third sensing area 100SA3. For example, the first sensing area 100SA1 may overlap a camera module, and the second and third sensing areas 100SA2 and 100SA3 may overlap a proximity illumination sensor. However, embodiments of the disclosure are not limited thereto.

Each of multiple electronic modules 2000 (see FIG. 4) may receive an external input transmitted through the first sensing area 100SA1, the second sensing area 100SA2 or the third sensing area 100SA3 or may provide an output signal through the first sensing area 100SA1, the second sensing area 100SA2 or the third sensing area 100SA3.

The first sensing area 100SA1 may be surrounded by the active area 1000A, and the second and third sensing areas 100SA2 and 100SA3 may be included in the active area 1000A. In other words, the second and third sensing areas 100SA2 and 100SA3 may display an image. Transmittances of the first, second and third sensing areas 100SA1, 100SA2 and 100SA3 may be higher than a transmittance of the active area 1000A. The transmittance of the first sensing area 100SA1 may be higher than the transmittances of the second and third sensing areas 100SA2 and 100SA3.

According to an embodiment of the disclosure, one or some of the electronic modules 2000 (see FIG. 4) may overlap the active area 1000A, and the other(s) of the electronic modules 2000 (see FIG. 4) may be surrounded by the active area 1000A. Thus, an area in which the electronic modules 2000 (see FIG. 4) may be disposed may not be provided in a peripheral area 1000NA defined around the active area 1000A. As a result, an area ratio of the active area 1000A to a front surface of the electronic device 1000 may be increased.

Figure 2:
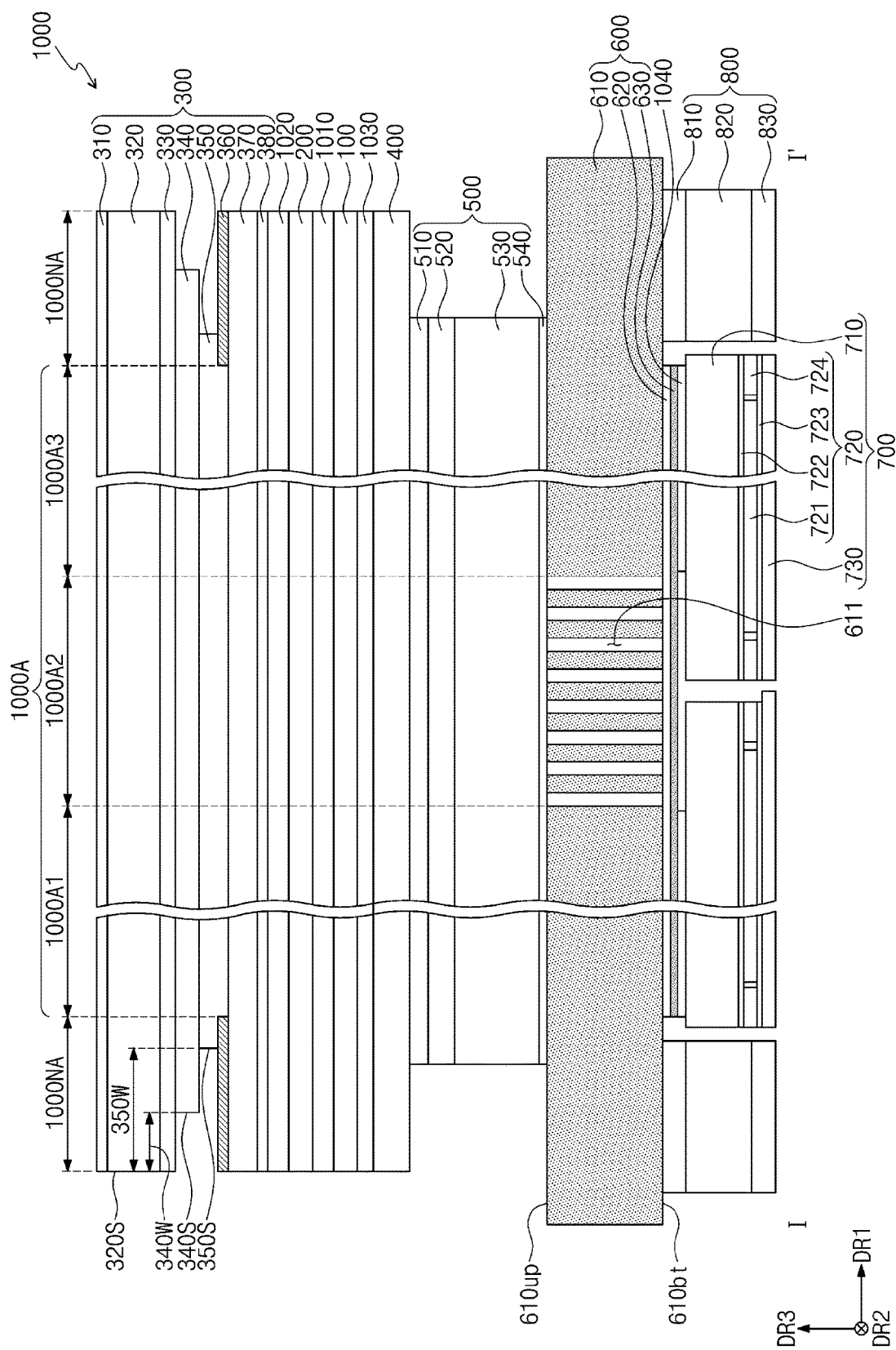
FIG. 2 is a schematic cross-sectional view taken along line I-I' of FIG. 1A to illustrate an electronic device according to an embodiment of the disclosure.
Figure 3A:
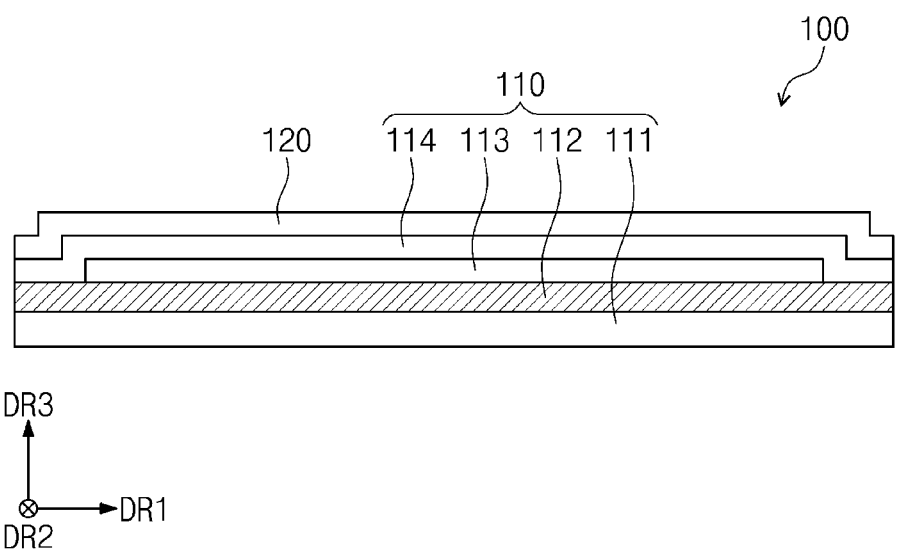
FIG. 3A is a schematic cross-sectional view illustrating a display panel according to an embodiment of the disclosure.

FIG. 2 is a schematic cross-sectional view taken along line I-I' of FIG. 1A to illustrate an electronic device according to an embodiment of the disclosure. FIG. 3A is a schematic cross-sectional view illustrating a display panel according to an embodiment of the disclosure.

Referring to FIG. 2, the electronic device 1000 may include a display panel 100, upper functional layers, and lower functional layers.

Referring to FIG. 3A, the display panel 100 may generate an image and may sense an input applied from the outside. For example, the display panel 100 may include a display layer 110 and a sensor layer 120. A thickness of the display panel 100 may range from about 25 micrometers to about 35 micrometers (e.g., may be about 30 micrometers). However, the thickness of the display panel 100 is not limited thereto.

The display layer 110 may be a component for substantially generating an image. The display layer 110 may be a light emitting type display layer. For example, the display layer 110 may be an organic light emitting display layer, a quantum-dot display layer, a micro LED display layer, or a nano LED display layer.

The display layer 110 may include a base layer 111, a circuit layer 112, a light emitting element layer 113, and an encapsulation layer 114.

The base layer 111 may include a synthetic resin layer. The synthetic resin layer may include a thermosetting resin. The base layer 111 may have a multi-layered structure. For example, the base layer 111 may have a three-layer structure of a synthetic resin layer, an adhesive layer and a synthetic resin layer. In particular, the synthetic resin layer may be a polyimide-based resin layer. However, embodiments of the disclosure are not limited to a kind of the material of the synthetic resin layer. The synthetic resin layer may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, and a perylene-based resin. In other embodiments, the base layer 111 may include a glass substrate, an organic/inorganic composite material substrate, or a combination thereof.

The circuit layer 112 may be disposed on the base layer 111. The circuit layer 112 may include an insulating layer, a semiconductor pattern, a conductive pattern, and a signal line. An insulating layer, a semiconductor layer and a conductive layer may be disposed (e.g., formed) on the base layer 111 by a coating method and/or a deposition method, and the insulating layer, the semiconductor layer and the conductive layer may be selectively patterned using photolithography processes. Thus, the semiconductor pattern, the conductive pattern and the signal line of the circuit layer 112 may be formed.

The light emitting element layer 113 may be disposed on the circuit layer 112. The light emitting element layer 113 may include a light emitting element. For example, the light emitting element layer 113 may include an organic light emitting material, a quantum dot, a quantum rod, a micro LED element, or a nano LED element.

The encapsulation layer 114 may be disposed on the light emitting element layer 113. The encapsulation layer 114 may include an inorganic layer, an organic layer, and an inorganic layer, which may be sequentially stacked on each other. However, layers constituting the encapsulation layer 114 are not limited thereto.

The inorganic layers may protect the light emitting element layer 113 from water and oxygen, and the organic layer may protect the light emitting element layer 113 from a foreign material such as dust particles. The inorganic layers may include a silicon nitride layer, a silicon oxynitride layer, a silicon oxide layer, a titanium oxide layer, an aluminum oxide layer, or a combination thereof. The organic layer may include, but is not limited to, an acrylic-based organic layer.

The sensor layer 120 may be disposed on the display layer 110. The sensor layer 120 may sense an external input applied from the outside. The external input may be a user's input. The user's input may include at least one of various external inputs such as a part (e.g., a finger) of a user's body, light, heat, a pen, and pressure.

The sensor layer 120 may be formed on the display layer 110 through continuous processes. The sensor layer 120 may be disposed on (e.g., directly on) the display layer 110. It is understood that in case that the sensor layer 120 may be disposed directly on the display layer 110, another component may not be disposed between the sensor layer 120 and the display layer 110. In other words, an additional adhesive member may not be disposed between the sensor layer 120 and the display layer 110.

In other embodiments, the sensor layer 120 may be coupled to the display layer 110 through an adhesive member. The adhesive member may include a general adhesive or glue.

Referring again to FIG. 2, the upper functional layers may be disposed on the display panel 100. For example, the upper functional layers may include an anti-reflection member 200 and an upper member 300.

The anti-reflection member 200 may be referred to as an anti-reflection layer. The anti-reflection member 200 may reduce a reflectance of external light incident from the outside. The anti-reflection member 200 may include an elongated synthetic resin film. For example, the anti-reflection member 200 may be formed by dyeing a polyvinyl alcohol (PVA) film with an iodine compound. However, the material of the anti-reflection member 200 is not limited thereto. A thickness of the anti-reflection member 200 may range from about 25 micrometers to about 35 micrometers (e.g., may be about 31 micrometers). However, the thickness of the anti-reflection member 200 is not limited thereto.

The anti-reflection member 200 may be coupled to the display panel 100 through a first adhesive layer 1010. The first adhesive layer 1010 may be a transparent adhesive layer such as a pressure sensitive adhesive (PSA) film, an optically clear adhesive (OCA) film, an optically clear resin (OCR), or a combination thereof. An adhesive layer described hereinafter may include a general adhesive, glue, or a combination thereof. A thickness of the first adhesive layer 1010 may range from about 20 micrometers to about 30 micrometers (e.g., may be about 25 micrometers). However, the thickness of the first adhesive layer 1010 is not limited thereto.

In a certain embodiment, the first adhesive layer 1010 may be omitted. The anti-reflection member 200 may be disposed on (e.g., directly on) the display panel 100. An additional adhesive layer may not be disposed between the anti-reflection member 200 and the display panel 100.

The upper member 300 may be disposed on the anti-reflection member 200. The upper member 300 may include a first hard coating layer 310, a protective layer 320, a first upper adhesive layer 330, a window 340, a second upper adhesive layer 350, a light blocking layer 360, an impact absorbing layer 370, and a second hard coating layer 380. However, components included in the upper member 300 are not limited to the components described above. In certain embodiments, at least one of the components described above may be omitted and/or other component(s) may be added to the upper member 300.

The first hard coating layer 310 may be a layer disposed at an outermost surface of the electronic device 1000. The first hard coating layer 310 may be a functional layer for improving use characteristics of the electronic device 1000 and may be provided on the protective layer 320 by a coating process. For example, the first hard coating layer 310 may improve an anti-fingerprint characteristic, an anti-fouling characteristic, and/or an anti-scratch characteristic.

The protective layer 320 may be disposed under the first hard coating layer 310. The protective layer 320 may protect components disposed under the protective layer 320. A chemical resistance layer and/or an anti-fingerprint layer may be additionally provided in the protective layer 320 to improve chemical resistance and/or wear resistance characteristics. The protective layer 320 may include a film having an elastic modulus of about 15 GPa or less at room temperature. A thickness of the protective layer 320 may range from about 50 micrometers to about 60 micrometers (e.g., may be about 55 micrometers). However, the thickness of the protective layer 320 is not limited thereto. In a certain embodiment, the protective layer 320 may be omitted.

The first upper adhesive layer 330 may be disposed under the protective layer 320. The protective layer 320 and the window 340 may be coupled to each other by the first upper adhesive layer 330. A thickness of the first upper adhesive layer 330 may range from about 20 micrometers to about 30 micrometers (e.g., may be about 25 micrometers). However, the thickness of the first upper adhesive layer 330 is not limited thereto.

The window 340 may be disposed under the first upper adhesive layer 330. The window 340 may include an optically transparent insulating material. For example, the window 340 may include a glass substrate, a synthetic resin film, or a combination thereof. In case that the window 340 may be the glass substrate, a thickness of the window 340 may be about 80 micrometers or less (e.g., about 30 micrometers). However, the thickness of the window 340 is not limited thereto.

In case that the window 340 may be the synthetic resin film, the window 340 may include a polyimide (PI) film, a polyethylene terephthalate (PET) film, or a combination thereof.

The window 340 may have a single-layered structure or a multi-layered structure. For example, the window 340 may include multiple synthetic resin films coupled to each other by an adhesive or may include a glass substrate and a synthetic resin film coupled to each other by an adhesive.

The second upper adhesive layer 350 may be disposed under the window 340. The window 340 and the impact absorbing layer 370 may be coupled to each other by the second upper adhesive layer 350. A thickness of the second upper adhesive layer 350 may range from about 30 micrometers to about 40 micrometers (e.g., may be about 35 micrometers). However, the thickness of the second upper adhesive layer 350 is not limited thereto.

In an embodiment, a sidewall 340S of the window 340 and a sidewall 350S of the second upper adhesive layer 350 may be laterally recessed from sidewalls of other layers, for example, a sidewall 100S of the display panel 100 and a sidewall 320S of the protective layer 320. It is understood that in case that a component may be laterally recessed from another component, it may be closer to the active area 1000A than another component.

A position relation between the layers may be changed by the folding operation of the electronic device 1000. According to the embodiment of the disclosure, since the sidewall 340S of the window 340 may be laterally recessed from the sidewall 100S of the display panel 100 and the sidewall 320S of the protective layer 320, the probability that the sidewall 340S of the window 340 protrudes from the sidewall 320S of the protective layer 320 may be reduced even though the position relation between the layers may be changed. Thus, the possibility that external impact may be transferred through the sidewall 340S of the window 340 may be reduced. As a result, the probability that a crack occurs at the window 340 may be reduced.

A first distance 340W between the sidewall 340S of the window 340 and the sidewall 320S of the protective layer 320 may be a predetermined distance or more. Here, the first distance 340W may mean a distance parallel to the first direction DR1. The first distance 340W may correspond to a distance between the sidewall 340S and the sidewall 320S in case viewed in a plan view.

The first distance 340W may range from about 180 micrometers to about 205 micrometers (e.g., may be about 196 micrometers). However, embodiments of the disclosure are not limited thereto. In certain embodiments, the first distance 340W may be 50 micrometers or more (e.g., 300 micrometers). The protective layer 320 may further protrude from the window 340 as the first distance 340W increases, and a portion of the protective layer 320 may be bent to be disposed on (e.g., adhered to) other component(s) (e.g., a case). The probability that a foreign material may be provided from a region on the protective layer 320 to a region under the protective layer 320 may be reduced as an area of the protective layer 320 increases.

The window 340 and the second upper adhesive layer 350 may be adhered to the impact absorbing layer 370 through a lamination process. In consideration of a tolerance of the lamination process, areas of the window 340 and the second upper adhesive layer 350 may be less than an area of the impact absorbing layer 370. The area of the second upper adhesive layer 350 may be less than the area of the window 340. For example, pressure may be applied to the second upper adhesive layer 350 in a process of adhering the window 340. The second upper adhesive layer 350 may be stretched in the first direction DR1 and the second direction DR2 by the pressure. At this time, the area of the second upper adhesive layer 350 may be less than the area of the window 340 so that the second upper adhesive layer 350 does not protrude from the window 340.

If the first and second upper adhesive layers 330 and 350 are adhered to each other, the window 340 may not slip in the folding operation of the electronic device 1000, and thus a buckling phenomenon may occur at the window 340. However, according to the embodiment of the disclosure, the area of the second upper adhesive layer 350 may be less than the area of the window 340. Thus, the first upper adhesive layer 330 may not be adhered to the second upper adhesive layer 350, and the probability that a foreign material is attached to the second upper adhesive layer 350 may be reduced.

A second distance 350W between the sidewall 350S of the second upper adhesive layer 350 and the sidewall 320S of the protective layer 320 may be a predetermined distance or more. Here, the second distance 350W may mean a distance parallel to the first direction DR1. The second distance 350W may correspond to a distance between the sidewall 350S and the sidewall 320S in case viewed in a plan view.

The second distance 350W may be, but is not limited to, about 392 micrometers. In a certain example, the second distance 350W may range from about 292 micrometers to about 492 micrometers. However, the second distance 350W is not limited to the range. The light blocking layer 360 may be disposed between the impact absorbing layer 370 and the second upper adhesive layer 350. The light blocking layer 360 may be printed on a top surface of the impact absorbing layer 370. The light blocking layer 360 may overlap the peripheral area 1000NA. The light blocking layer 360 may be a colored layer and may be formed by a coating method. The light blocking layer 360 may include a colored organic material or an opaque metal. However, the material of the light blocking layer 360 is not limited thereto.

The light blocking layer 360 disposed on the top surface of the impact absorbing layer 370 is illustrated as an example in FIG. 2. However, the position of the light blocking layer 360 is not limited thereto. In certain embodiments, the light blocking layer 360 may be provided on a top surface of the protective layer 320, a bottom surface of the protective layer 320, a top surface of the window 340, or a bottom surface of the window 340. In certain embodiments, the light blocking layer 360 may include multiple layers. At least one of the layers of the light blocking layer 360 may be provided on the top surface of the impact absorbing layer 370, and at least another of the layers of the light blocking layer 360 may be provided on the top surface of the protective layer 320, the bottom surface of the protective layer 320, the top surface of the window 340, or the bottom surface of the window 340.

The impact absorbing layer 370 may be a functional layer for protecting the display panel 100 from an external impact. The impact absorbing layer 370 may include a film having an elastic modulus of about 1 GPa or more at room temperature. The impact absorbing layer 370 may be a stretched film having an optical function. For example, the impact absorbing layer 370 may be an optical axis control film. A thickness of the impact absorbing layer 370 may range from about 35 micrometers to about 45 micrometers (e.g., may be about 41 micrometers). However, the thickness of the impact absorbing layer 370 is not limited thereto. In a certain embodiment, the impact absorbing layer 370 may be omitted.

The second hard coating layer 380 may be provided on a surface of the impact absorbing layer 370. The impact absorbing layer 370 may include an uneven surface. The top surface of the impact absorbing layer 370 may be in contact with the second upper adhesive layer 350. An uneven portion of the top surface of the impact absorbing layer 370 may be filled with the second upper adhesive layer 350. Thus, an optical issue may not occur at the top surface of the impact absorbing layer 370. A bottom surface of the impact absorbing layer 370 may be planarized by the second hard coating layer 380. In other words, in case that a first hole 101H (see FIG. 4) extends to a second adhesive layer 1020, a surface exposed by the first hole 101H (see FIG. 4) may be smooth. The second hard coating layer 380 may cover the uneven surface of the impact absorbing layer 370, and thus a haze occurring at an uneven surface may be prevented.

The upper member 300 may be coupled to the anti-reflection member 200 through the second adhesive layer 1020. The second adhesive layer 1020 may include a general adhesive, glue or a combination thereof. A thickness of the second adhesive layer 1020 may range from about 20 micrometers to about 30 micrometers (e.g., may be about 25 micrometers). However, the thickness of the second adhesive layer 1020 is not limited thereto.

The lower functional layers may be disposed under the display panel 100. For example, the lower functional layers may include a lower protective film 400, a cushion member 500, a first lower member 600, a second lower member 700, and a step-difference compensation member (or an adhesive member) 800. However, components included in the lower functional layers are not limited to the components described above. At least one of the components described above may be omitted and/or other component(s) may be added to the lower functional layers.

The lower protective film 400 may be coupled to a rear surface of the display panel 100 through a third adhesive layer 1030. The lower protective film 400 may prevent a scratch from occurring at the rear surface of the display panel 100 in a process of manufacturing the display panel 100. The lower protective film 400 may be a colored polyimide film. For example, the lower protective film 400 may be, but is not limited to, an opaque yellow film.

A thickness of the lower protective film 400 may range from about 30 micrometers to about 50 micrometers (e.g., may be about 40 micrometers). A thickness of the third adhesive layer 1030 may range from about 13 micrometers to about 25 micrometers (e.g., may be about 18 micrometers). However, the thicknesses of the lower protective film 400 and the third adhesive layer 1030 are not limited thereto.

The cushion member 500 may be disposed under the lower protective film 400. The cushion member 500 may protect the display panel 100 from an impact transferred toward the rear surface of the display panel 100. Impact resistance characteristics of the electronic device 1000 may be improved by the cushion member 500.

The cushion member 500 may include a first cushion adhesive layer 510, a barrier film 520, a cushion layer 530, and a second cushion adhesive layer 540. However, components included in the cushion member 500 are not limited to the components described above. At least one of the components described above may be omitted and/or other component(s) may be added to the cushion member 500.

The first and second cushion adhesive layers 510 and 540 may include a general adhesive, glue, or a combination thereof. The first cushion adhesive layer 510 may be adhered to the lower protective film 400, and the second cushion adhesive layer 540 may be adhered to the first lower member 600. A thickness of the first cushion adhesive layer 510 may range from about 20 micrometers to about 30 micrometers (e.g., may be about 25 micrometers). A thickness of the second cushion adhesive layer 540 may range from about 4 micrometers to about 15 micrometers (e.g., may be about 8 micrometers). However, the thicknesses of the first and second cushion adhesive layers 510 and 540 are not limited thereto.

The barrier film 520 may be provided to improve impact resistance characteristics. The barrier film 520 may prevent deformation of the display panel 100. The barrier film 520 may be, but is not limited to, a synthetic resin film (e.g., a polyimide film). A thickness of the barrier film 520 may range from about 30 micrometers to about 40 micrometers (e.g., may be about 35 micrometers). However, the thickness of the barrier film 520 is not limited thereto.

The cushion layer 530 may include, for example, foam, sponge, or a combination thereof. The foam may include polyurethane foam, thermoplastic polyurethane foam, or a combination thereof. In case that the cushion layer 530 includes foam, the cushion layer 530 may be formed using the barrier film 520 as a base layer. For example, a foaming agent may be provided on the barrier film 520 to form the cushion layer 530.

A thickness of the cushion layer 530 may range from about 80 micrometers to about 120 micrometers (e.g., may be about 100 micrometers). However, the thickness of the cushion layer 530 is not limited thereto.

At least one of the barrier film 520 and the cushion layer 530 may have a color capable of absorbing light. For example, at least one of the barrier film 520 or the cushion layer 530 may have a black color. It may be possible to prevent components disposed under the cushion member 500 from being visible to the outside.

The first lower member 600 may be disposed under the cushion member 500. The first lower member 600 may include a plate 610, a lower adhesive layer 620, and a cover layer 630. However, components included in the first lower member 600 are not limited to the components described above. At least one of the components described above may be omitted and/or other component(s) may be added to the first lower member 600.

The plate 610 may include a material having an elastic modulus of about 60 GPa or more at room temperature. The plate 610 may include a metal, a metal alloy, or a combination thereof. For example, the plate 610 may include, but is not limited to, SUS304. The plate 610 may support the components disposed thereon. Heat dissipation performance of the electronic device 1000 may be improved by the plate 610.

The plate 610 may have a top surface 610up and a bottom surface 610bt. The top surface 610up of the plate 610 may be disposed between the bottom surface 610bt of the plate 610 and the display panel 100.

An opening 611 may be defined in a portion of the plate 610. The opening 611 may be defined in an area overlapping the second area 1000A2. The opening 611 may overlap the second area 1000A2 in case viewed in a plan view (e.g., in the third direction DR3 or a thickness direction of the plate 610). A shape of the portion of the plate 610 may be more easily deformed by the opening 611.

The cover layer 630 may be adhered to the plate 610 by the lower adhesive layer 620. The lower adhesive layer 620 may include a general adhesive, glue, or a combination thereof. The cover layer 630 may cover the opening 611 of the plate 610. Thus, it may be possible to prevent a foreign material from entering the opening 611.

The cover layer 630 may include a material having an elastic modulus lower than the elastic modulus of the plate 610. For example, the cover layer 630 may include, but is not limited to, thermoplastic polyurethane.

A thickness of the plate 610 may range from about 120 micrometers to about 180 micrometers (e.g., may be about 150 micrometers). A thickness of the lower adhesive layer 620 may range from about 4 micrometers to about 15 micrometers (e.g., may be about 8 micrometers). A thickness of the cover layer 630 may range from about 4 micrometers to about 15 micrometers (e.g., may be about 8 micrometers). However, the thicknesses of the plate 610, the lower adhesive layer 620 and the cover layer 630 are not limited to the values described above.

The second lower members 700 may be disposed under the first lower member 600. The second lower members 700 may be spaced apart from each other. For example, one of the second lower members 700 may overlap the first area 1000A1, and another of the second lower members 700 may overlap the third area 1000A3.

The second lower members 700 may be adhered to the first lower member 600 by fourth adhesive layers 1040, respectively. For example, one of the fourth adhesive layers 1040 may be adhered to a bottom surface of the first lower member 600 overlapping the first area 1000A1, and another of the fourth adhesive layers 1040 may be adhered to the bottom surface of the first lower member 600 overlapping the third area 1000A3. The fourth adhesive layers 1040 may not overlap the second area 1000A2. A thickness of each of the fourth adhesive layers 1040 may range from about 8 micrometers to about 15 micrometers (e.g., may be about 8 micrometers). However, the thickness of each of the fourth adhesive layers 1040 is not limited thereto.

Even though not shown in the drawings, a step-difference compensation film may further be disposed between each of the second lower members 700 and the first lower member 600. For example, the step-difference compensation film may be provided in an area overlapping the second area 1000A2. An adhesive strength of one surface of the step-difference compensation film may be lower than an adhesive strength of another surface of the step-difference compensation film. For example, the one surface may not have an adhesive strength. The one surface may face the first lower member 600.

Each of the second lower members 700 may include a lower plate 710, a heat dissipation sheet 720, and an insulating film 730. However, components included in each of the second lower members 700 are not limited to the components described above. At least one of the components described above may be omitted and/or other component(s) may be added to each of the second lower members 700.

The lower plate 710 may be provided in plurality. One of the lower plates 710 may overlap the first area 1000A1 and a portion of the second area 1000A2, and another of the lower plates 710 may overlap the third area 1000A3 and another portion of the second area 1000A2.

The lower plates 710 may be spaced apart from each other in the second area 1000A2. However, the lower plates 710 may be disposed as close to each other as possible to support the portion of the plate 610 in which the opening 611 may be formed. For example, the lower plates 710 may prevent a shape of the portion, having the opening 611, of the plate 610 from being deformed by pressure applied from above.

The lower plates 710 may prevent shapes of components disposed on the second lower members 700 from being deformed by component(s) disposed under the second lower members 700.

Each of the lower plates 710 may include a metal alloy, for example, a copper alloy. However, the material of the lower plates 710 is not limited thereto. A thickness of each of the lower plates 710 may range from about 60 micrometers to about 100 micrometers (e.g., may be about 80 micrometers). However, the thickness of each of the lower plates 710 is not limited thereto.

The heat dissipation sheet 720 may be adhered to a bottom surface of the lower plate 710. The heat dissipation sheet 720 may be a heat-conductive sheet having high thermal conductivity. For example, the heat dissipation sheet 720 may include a heat dissipation layer 721, a first heat dissipation adhesive layer 722, a second heat dissipation adhesive layer 723, and a gap tape 724.

The gap tape 724 may be adhered to the first and second heat dissipation adhesive layers 722 and 723 which may be spaced apart from each other with the heat dissipation layer 721 interposed therebetween. The gap tape 724 may consist of multiple layers. For example, the gap tape 724 may include a base material layer, an upper adhesive layer disposed on a top surface of the base material layer, and a lower adhesive layer disposed on a bottom surface of the base material layer.

The heat dissipation layer 721 may be adhered to the lower plate 710 by the first heat dissipation adhesive layer 722. The heat dissipation layer 721 may be sealed by the first heat dissipation adhesive layer 722, the second heat dissipation adhesive layer 723, and the gap tape 724. The heat dissipation layer 721 may be a graphitized polymer film. The polymer film may be, for example, a polyimide film. A thickness of each of the first and second heat dissipation adhesive layers 722 and 723 may range from about 3 micrometers to about 8 micrometers (e.g., may be about 5 micrometers), and a thickness of each of the heat dissipation layer 721 and the gap tape 724 may range from about 10 micrometers to about 25 micrometers (e.g., may be about 17 micrometers). However, the thicknesses of the first and second heat dissipation adhesive layers 722 and 723, the heat dissipation layer 721 and the gap tape 724 are not limited to the values described above.

The insulating film 730 may be adhered to a bottom surface of the heat dissipation sheet 720. For example, the insulating film 730 may be adhered to the second heat dissipation adhesive layer 723. The insulating film 730 may prevent a rattle of the electronic device 1000 from occurring. A thickness of the insulating film 730 may be, but is not limited to, about 15 micrometers.

The step-difference compensation member 800 may be adhered to the bottom surface 610bt of the plate 610. For example, the lower adhesive layer 620 may be adhered to a portion of the bottom surface 610bt of the plate 610, and the step-difference compensation member 800 may be adhered to another portion of the bottom surface 610bt of the plate 610.

The step-difference compensation member 800 may include a first compensation adhesive layer 810, a step-difference compensation film 820, and a second compensation adhesive layer 830. The first compensation adhesive layer 810 may be adhered to the bottom surface 610bt of the plate 610. The step-difference compensation film 820 may be a synthetic resin film. The second compensation adhesive layer 830 may be adhered to a bottom surface of the step-difference compensation film 820 and a set (not shown). The set may be a component including an intermediate case adhered to the step-difference compensation film 820. The component may further include a battery, a main board and a camera module which may be disposed under the intermediate case. However, embodiments of the disclosure are not limited thereto.

Figure 3B:
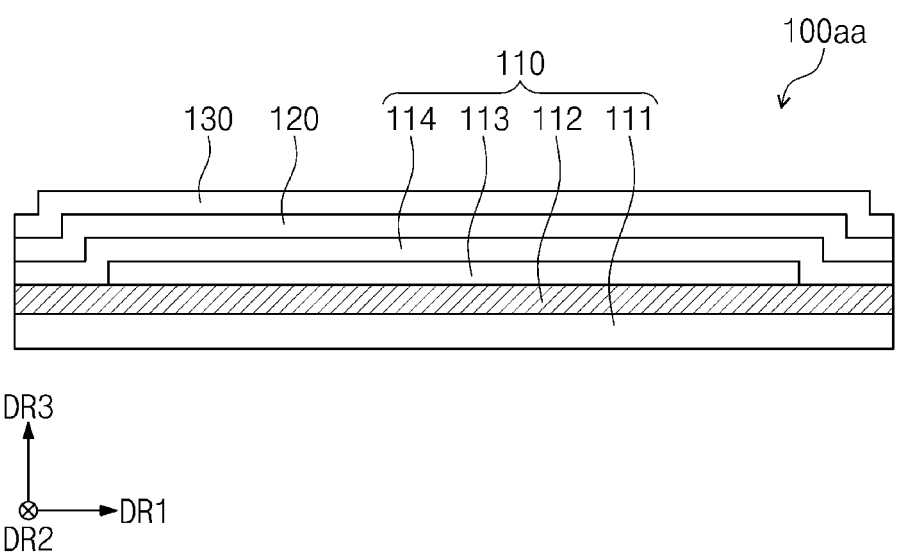
FIG. 3B is a schematic cross-sectional view illustrating a display panel according to an embodiment of the disclosure.

FIG. 3B is a schematic cross-sectional view illustrating a display panel according to an embodiment of the disclosure.

Referring to FIG. 3B, a display panel 100aa may further include an anti-reflection layer 130, as compared with the display panel 100 described above with reference to FIG. 3A. The anti-reflection member 200 (see FIG. 2) and the first adhesive layer 1010 (see FIG. 2) may be omitted in the electronic device 1000 (see FIG. 2) including the display panel 100aa.

The display panel 100aa may include the display layer 110, the sensor layer 120, and the anti-reflection layer 130.

The anti-reflection layer 130 according to an embodiment of the disclosure may include color filters. The color filters may be arranged in a predetermined form. The arrangement of the color filters may be determined in consideration of light emitting colors of pixels included in the display layer 110. The anti-reflection layer 130 may further include a black matrix adjacent to the color filters.

The anti-reflection layer 130 according to an embodiment of the disclosure may include a destructive interference structure. For example, the destructive interference structure may include a first reflective layer and a second reflective layer which may be disposed on different layers. First reflected light and second reflected light respectively reflected from the first reflective layer and the second reflective layer may destructively interfere with each other, and thus a reflectance of external light may be reduced.

Figure 4:
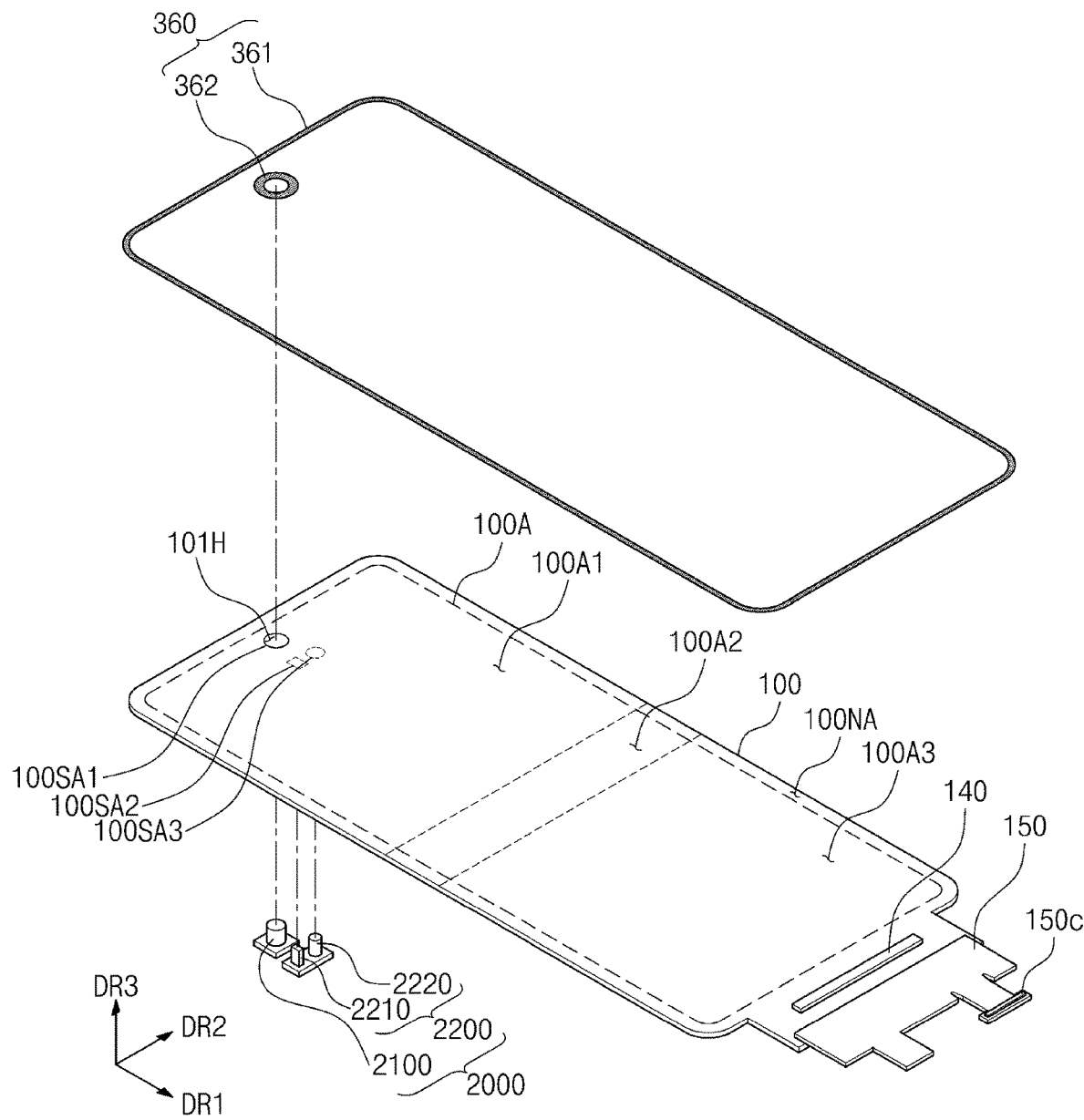
FIG. 4 is an exploded schematic perspective view illustrating components of an electronic device according to an embodiment of the disclosure.

FIG. 4 is an exploded schematic perspective view illustrating components of an electronic device according to an embodiment of the disclosure.

Referring to FIG. 4, the light blocking layer 360, the display panel 100, a driving chip 140, a circuit film 150 and multiple electronic modules 2000 of components of the electronic device 1000 (see FIG. 2) are illustrated as an example. The electronic modules 2000 may include a camera module 2100 and a proximity illumination sensor 2200.

The proximity illumination sensor 2200 may include a light emitting module 2210 and a light receiving module 2220. The light emitting module 2210 and the light receiving module 2220 may be mounted on a single substrate. The light emitting module 2210 may generate light and may output the generated light. For example, the light emitting module 2210 may output infrared light. The light emitting module 2210 may include a light emitting diode. The light receiving module 2220 may sense infrared light. The light receiving module 2220 may be activated in case sensing the infrared light of a predetermined level or more. The light receiving module 2220 may include a CMOS sensor. After the infrared light generated in the light emitting module 2210 is outputted, the infrared light may be reflected by an external object (e.g., a user's finger or face) and the reflected infrared light may be incident to the light receiving module 2220.

An active area 100A and a peripheral area 100NA may be defined in the display panel 100. The active area 100A may correspond to the active area 1000A illustrated in FIG. 1A, and the peripheral area 100NA may correspond to the peripheral area 1000NA illustrated in FIG. 1A.

The first sensing area 100SA1 overlapping the camera module 2100 may be surrounded by the active area 100A. The second sensing area 100SA2 overlapping the light emitting module 2210 and the third sensing area 100SA3 overlapping the light receiving module 2220 may be portions of the active area 100A.

A first hole 101H may be defined in a portion of the display panel 100. The first hole 101H may be provided to correspond to the first sensing area 100SA1. Thus, the camera module 2100 may receive an external input transmitted through the first hole 101H.

The light blocking layer 360 may include a first light blocking pattern 361 and a second light blocking pattern 362. The first light blocking pattern 361 may cover the peripheral area 100NA. The second light blocking pattern 362 may surround the camera module 2100 in case viewed in a plan view.

A first area 100A1, a second area 100A2 and a third area 100A3 which may be sequentially arranged in the first direction DR1 may be defined in the display panel 100. The second area 100A2 may be foldable along the folding axis FX (see FIG. 1A). The first, second and third areas 100A1, 100A2 and 100A3 may overlap or correspond to the first, second and third areas 1000A1, 1000A2 and 1000A3 illustrated in FIG. 1A, respectively.

The driving chip 140 may be mounted on the peripheral area 100NA of the display panel 100, and the circuit film 150 may be adhered to the peripheral area 100NA of the display panel 100.

The driving chip 140 may be a chip-type timing control circuit. The driving chip 140 may be referred to as a display driver IC. However, embodiments of the disclosure are not limited thereto. In a certain embodiment, the driving chip 140 may be mounted on a separate film from the display panel 100. The driving chip 140 may be electrically connected to the display panel 100 through the film, and the circuit film 150 may be adhered to the film.

A connector 150c for receiving a signal provided from a central processing unit (CPU) included in the electronic device 1000 (see FIG. 1A) may be disposed at the circuit film 150. The circuit film 150 may be extended to the peripheral area 100NA adjacent to the third area 100A3.

Figure 5:
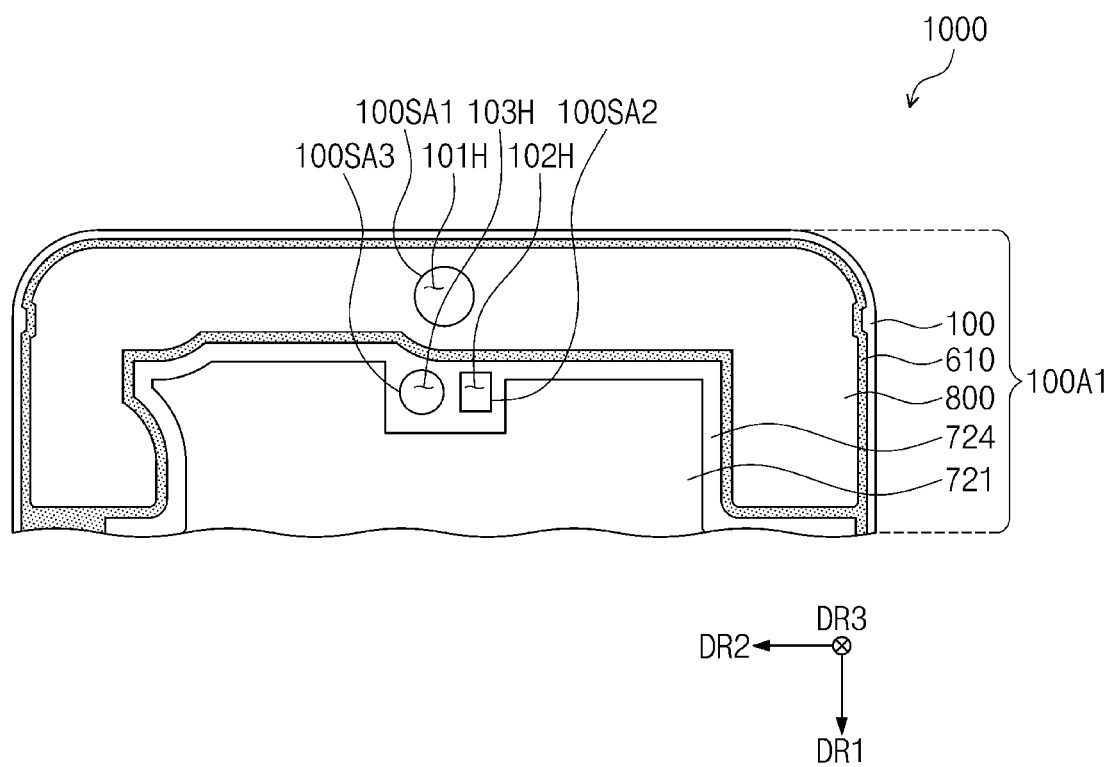
FIG. 5 is a schematic rear view illustrating components of an electronic device according to an embodiment of the disclosure.

FIG. 5 is a schematic rear view illustrating components of an electronic device according to an embodiment of the disclosure.

Referring to FIGS. 4 and 5, the display panel 100, the plate 610, the step-difference compensation member 800, the heat dissipation layer 721 and the gap tape 724 are illustrated as an example.

The first hole 101H, a second hole 102H and a third hole 103H may be provided to correspond to the first sensing area 100SA1, the second sensing area 100SA2 and the third sensing area 100SA3, respectively. The first to third holes 101H, 102H and 103H may be provided to overlap the first area 100A1 of the display panel 100.

The first to third holes 101H, 102H and 103H may be formed by removing portions of some components of the electronic device 1000 (see FIG. 1A), and this will be described later in detail.

The first hole 101H may overlap the step-difference compensation member 800, and the second and third holes 102H and 103H may overlap the gap tape 724. Thus, the first hole 101H may be surrounded by the step-difference compensation member 800 in case viewed in a plan view, and each of the second and third holes 102H and 103H may be surrounded by the gap tape 724 in case viewed in a plan view.

Figure 6:
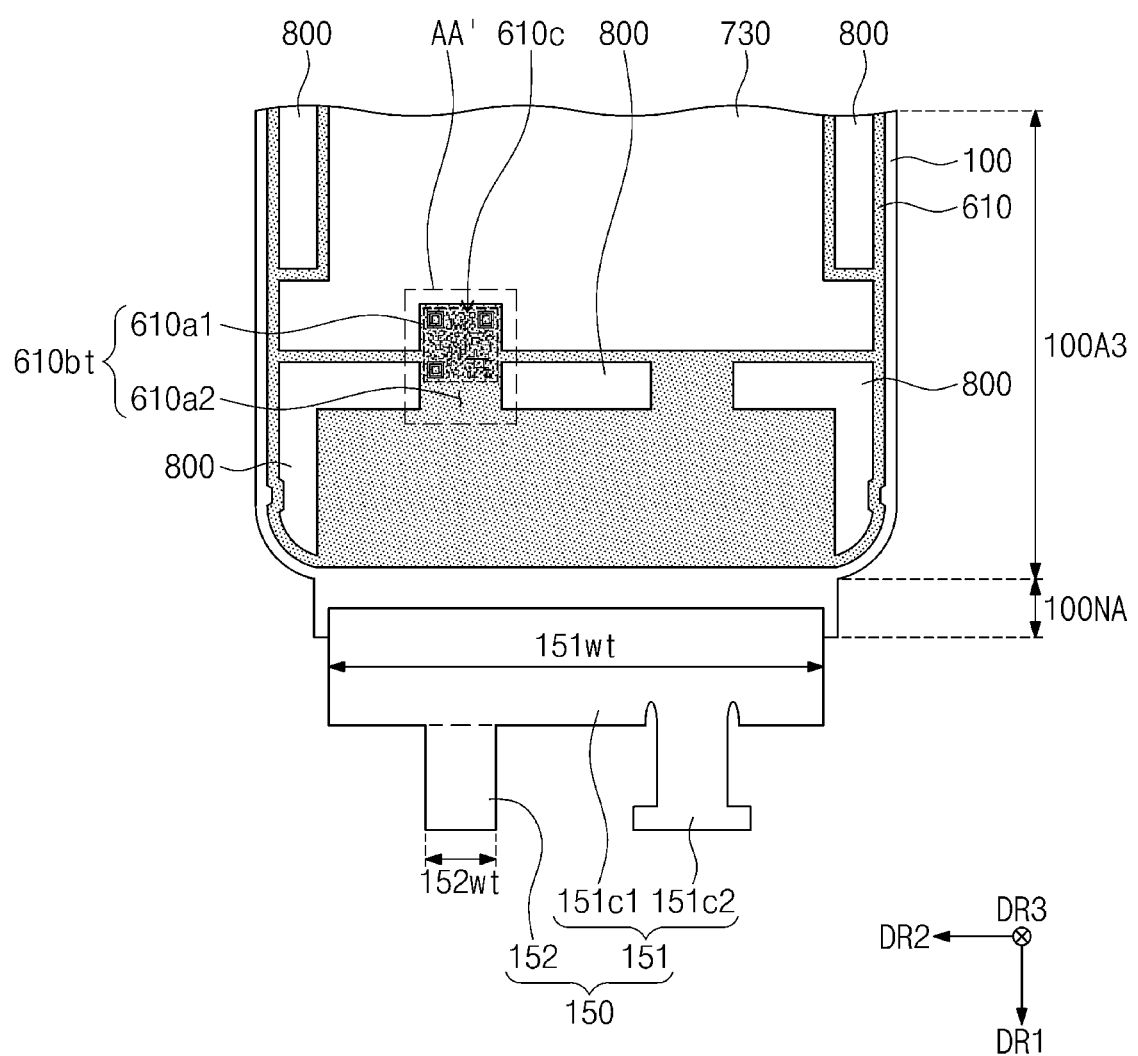
FIG. 6 is a schematic rear view illustrating components of an electronic device according to an embodiment of the disclosure.

FIG. 6 is a schematic rear view illustrating components of an electronic device according to an embodiment of the disclosure.

Referring to FIGS. 4 and 6, the display panel 100, the plate 610, the step-difference compensation member 800, the insulating film 730 and the circuit film 150 are illustrated.

A first area (or a code area) 610a1 and a second area 610a2 adjacent to the first area 610a1 may be defined in the bottom surface 610bt of the plate 610. A unique code 610c may be printed in the first area 610a1. The second area 610a2 may mean the remaining area of the bottom surface 610bt of the plate 610 except the first area 610a1.

The unique code 610c may be provided on the bottom surface 610bt of the plate 610. For example, the unique code 610c may be provided in the form of a quick response (QR) code. However, embodiments of the disclosure are not limited thereto. In certain embodiments, the unique code 610c may be provided in the form of a bar code or may be provided in the form of a unique number. The unique code 610c may be engraved on the bottom surface 610bt of the plate 610 by a laser.

The circuit film 150 may be adhered to the peripheral area 100NA adjacent to the third area 100A3 of the display panel 100. The unique code 610c may be provided in an area adjacent to the circuit film 150. For example, the unique code 610c may be provided in the first area 610a1 of the bottom surface 610bt of the plate 610, which overlaps the third area 100A3 of the display panel 100.

The circuit film 150 may be a flexible circuit board. The circuit film 150 may include a first portion 151 and a second portion 152. The first portion 151 may be used to transmit a signal provided from the central processing unit (not shown) to the display panel 100. Thus, the first portion 151 may include interconnection lines for transmitting electrical signals.

The first portion 151 may include a first connection portion 151c1 and a second connection portion 151c2. The second connection portion 151c2 may extend from the first connection portion 151c1, and the connector 150c described above in FIG. 4 may be extended to the second connection portion 151c2. However, the shape of the first portion 151 is not limited thereto. The second connection portion 151c2 protruding from the first connection portion 151c1 in the first direction DR1 is illustrated as an example in FIG. 6. In other embodiments, the second connection portion 151c2 may protrude from the first connection portion 151c1 in the second direction DR2. In a certain embodiment, the second connection portion 151c2 may be omitted.

The second portion 152 may protrude and extend from the first portion 151 in the first direction DR1. A maximum width 151wt of the first portion 151 in the second direction DR2 may be greater than a maximum width 152wt of the second portion 152 in the second direction DR2.

Figure 7:
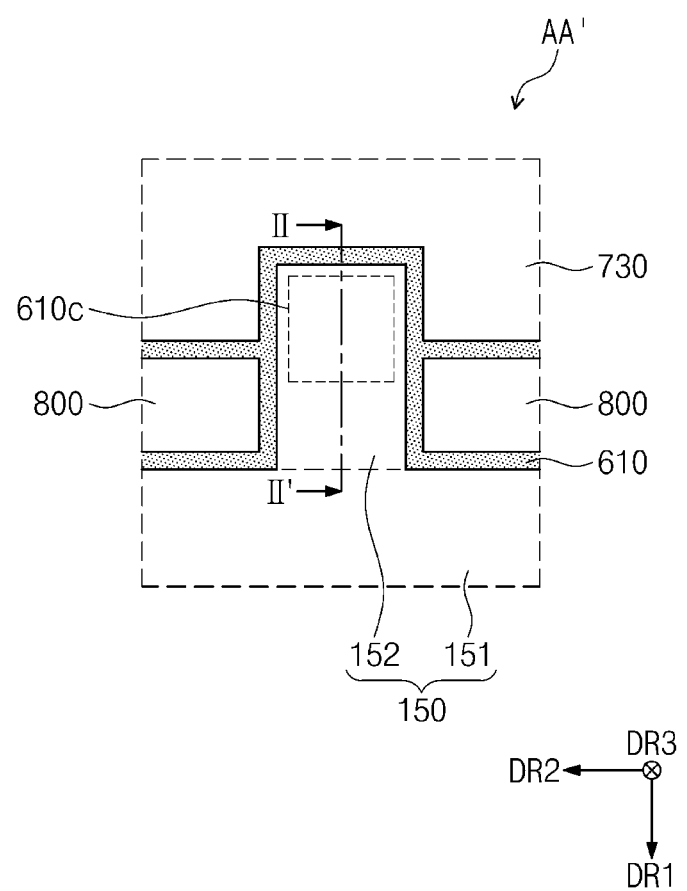
FIG. 7 is an enlarged schematic rear view of area AA' of FIG. 6.
Figure 8:
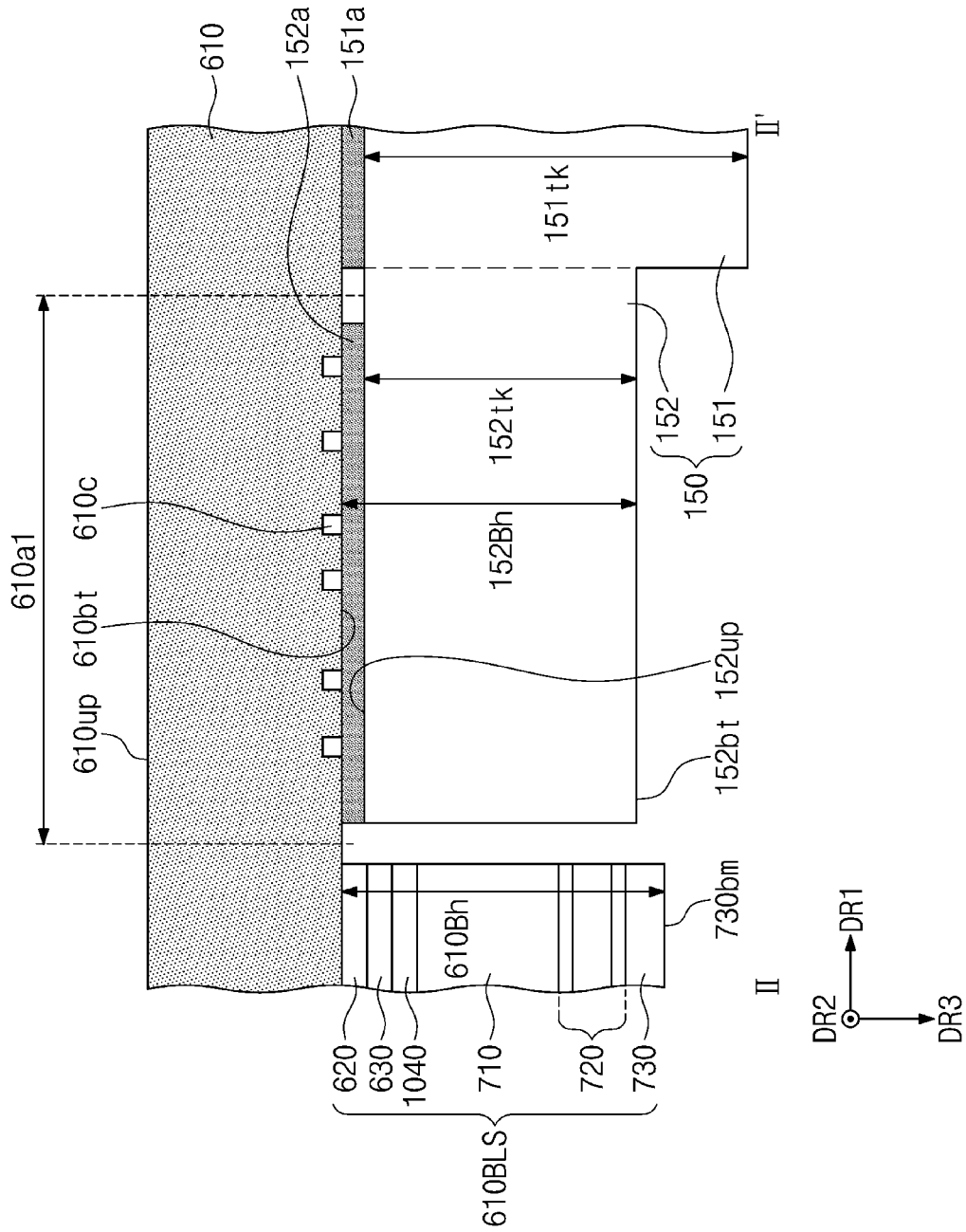
FIG. 8 is a schematic cross-sectional view taken along line II-IF of FIG. 7 to illustrate an electronic device according to an embodiment of the disclosure.

FIG. 7 is an enlarged schematic rear view of area AA' of FIG. 6. FIG. 8 is a schematic cross-sectional view taken along line II-IF of FIG. 7 to illustrate an electronic device according to an embodiment of the disclosure.

Referring to FIGS. 7 and 8, the lower adhesive layer 620, the cover layer 630, the fourth adhesive layer 1040, the lower plate 710, the heat dissipation sheet 720 and the insulating film 730 which may be disposed under the plate 610 are illustrated. The lower adhesive layer 620, the cover layer 630, the fourth adhesive layer 1040, the lower plate 710, the heat dissipation sheet 720 and the insulating film 730 may be referred to as lower layers 610BLS.

The lower layers 610BLS may be adhered to the plate 610 and may expose the code area 610a1. The code area 610a1 of the plate 610 exposed by the lower layers 610BLS may be covered by the second portion 152 of the circuit film 150.

A concave area corresponding to the code area 610a1 may be defined in the lower layers 610BLS in case viewed in a plan view or in the third direction DR3 or the thickness direction of the plate 610. Since the second portion 152 of the circuit film 150 covers the code area 610a1, a portion of the second portion 152 may be surrounded by the lower layers 610BLS.

The second portion 152 of the circuit film 150 may include an insulating material. For example, the second portion 152 may include a polyimide film or may include a polyimide film and at least one insulating layer stacked on the polyimide film.

In case that the plate 610 is in contact with the set, electrical noise may be generated. The electrical noise may reduce touch sensitivity of the sensor layer 120 (see FIG. 3A) and/or may cause noise at an image displayed by the display layer 110 (see FIG. 3A). However, according to the embodiment of the disclosure, the code area 610a1 of the plate 610 may be covered by the circuit film 150 having insulation properties. Thus, the possibility that the plate 610 is in contact with the set disposed under the lower layers 610BLS may be reduced or removed. As a result, the reduction in touch sensitivity may be inhibited or prevented and the possibility of occurrence of the noise may be reduced, and thus reliability of the electronic device 1000 (see FIG. 1A) may be improved.

The second portion 152 of the circuit film 150 may compensate a step difference between an area where the lower layers 610BLS may be disposed and an area where the lower layers 610BLS may not be disposed. Thus, durability on impact of the electronic device 1000 (see FIG. 1A) may be improved by the second portion 152.

The circuit film 150 may have different thicknesses in different areas. For example, a thickness 152tk of the second portion 152 of the circuit film 150 may be less than a thickness 151tk of the first portion 151 of the circuit film 150. The first portion 151 may further include the interconnection lines, unlike the second portion 152. Thus, the first portion 151 may be thicker than the second portion 152.

For example, the thickness of the second portion 152 of the circuit film 150 may be similar to a thickness (or total thickness) 610Bh of the lower layers 610BLS. The thickness 152tk of the second portion 152 may be less than the thickness 610Bh of the lower layers 610BLS. Thus, even though the second portion 152 is additionally provided, the second portion 152 may not interfere with the placement of the set or battery under the lower layers 610BLS.

The lower layers 610BLS may protrude from the bottom surface 610*bt* of the plate 610 to the same level as or a lower level than a bottom surface 152*bt* of the second portion 152. A distance between the bottom surface 610*bt* of the plate 610 and a bottommost surface 730*bm* of the insulating film 730 may be equal to the thickness 610Bh of the lower layers 610BLS. Thus, the distance between the bottom surface 610*bt* of the plate 610 and the bottommost surface 730*bm* of the insulating film 730 may be equal to or greater than a distance 152Bh between the bottom surface 610*bt* of the plate 610 and the bottom surface 152*bt* of the second portion 152. For example, the distance between the bottom surface 610*bt* of the plate 610 and the bottommost surface 730*bm* of the insulating film 730 may be about 146 micrometers, and the distance 152Bh between the bottom surface 610*bt* of the plate 610 and the bottom surface 152*bt* of the second portion 152 may be about 146 micrometers or less.

A conductive tape 151*a* may be disposed between the first portion 151 of the circuit film 150 and the plate 610 (e.g., above the upper surface 152*up* of the circuit film 150). The conductive tape 151*a* may prevent charges from being accumulated in the circuit film 150. For example, charges generated in the circuit film 150 may move to the plate 610 through the conductive tape 151*a*. In other words, the conductive tape 151*a* may provide an anti-charging effect.

An adhesive layer 152*a* may be disposed between the second portion 152 of the circuit film 150 and the plate 610. The adhesive layer 152*a* may include a general adhesive, glue, or a combination thereof. The adhesive layer 152*a* may fix the second portion 152 on the code area 610*a*1 of the plate 610.

Figure 9:
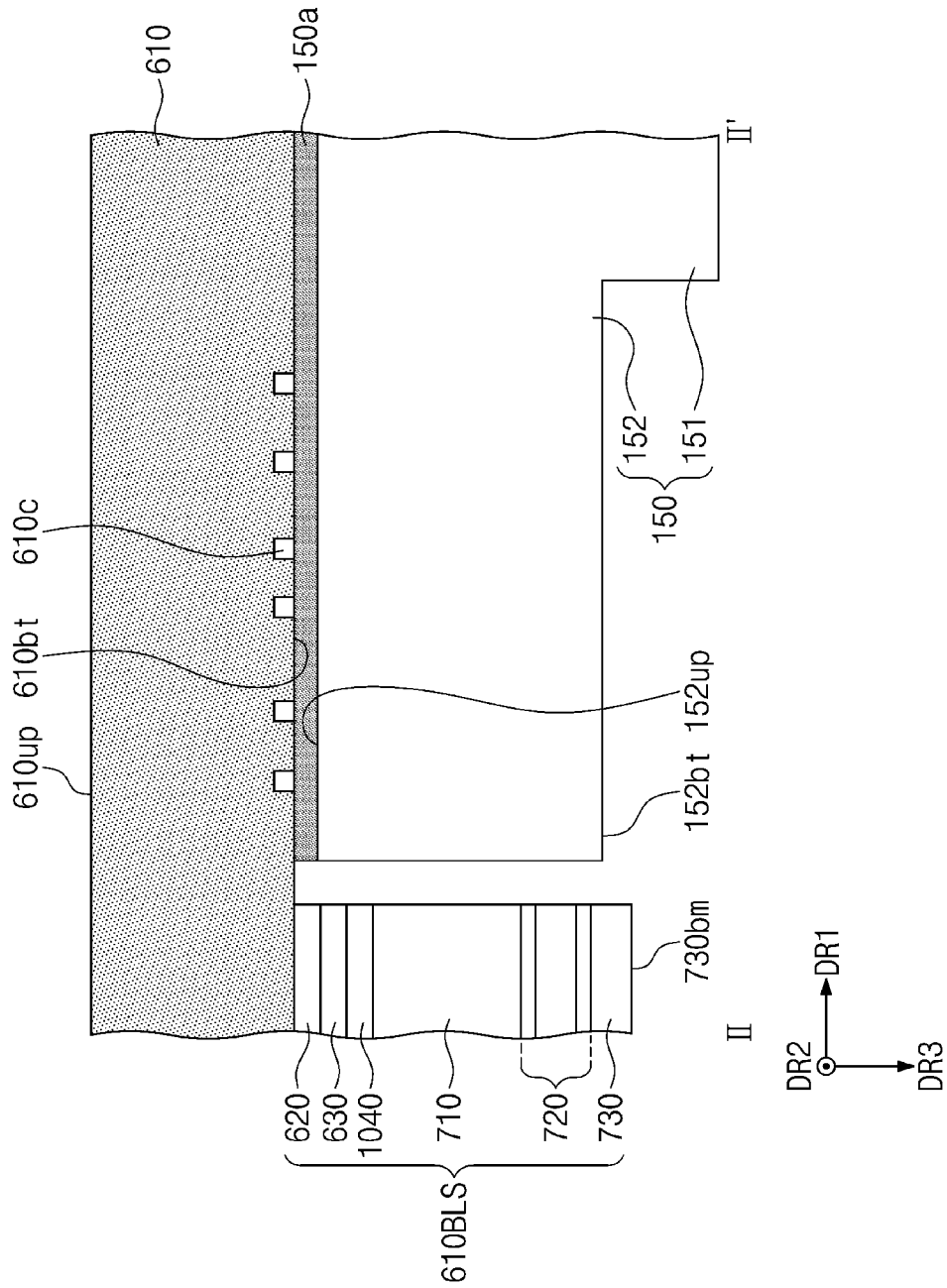
FIG. 9 is a schematic cross-sectional view taken along line II-IF of FIG. 7 to illustrate an electronic device according to an embodiment of the disclosure.

FIG. 9 is a schematic cross-sectional view taken along line II-IF of FIG. 7 to illustrate an electronic device according to an embodiment of the disclosure. Hereinafter, differences between the embodiment of FIG. 9 and the embodiment of FIG. 8 will be described.

Referring to FIG. 9, a conductive tape 150*a* may be disposed between the circuit film 150 and the plate 610. The conductive tape 150*a* may be disposed between the first portion 151 and the plate 610 and between the second portion 152 and the plate 610.

In other words, unlike the embodiment described above, the conductive tape 150*a* adhered between the first portion 151 and the plate 610 may extend between the second portion 152 and the plate 610.

Figure 10:
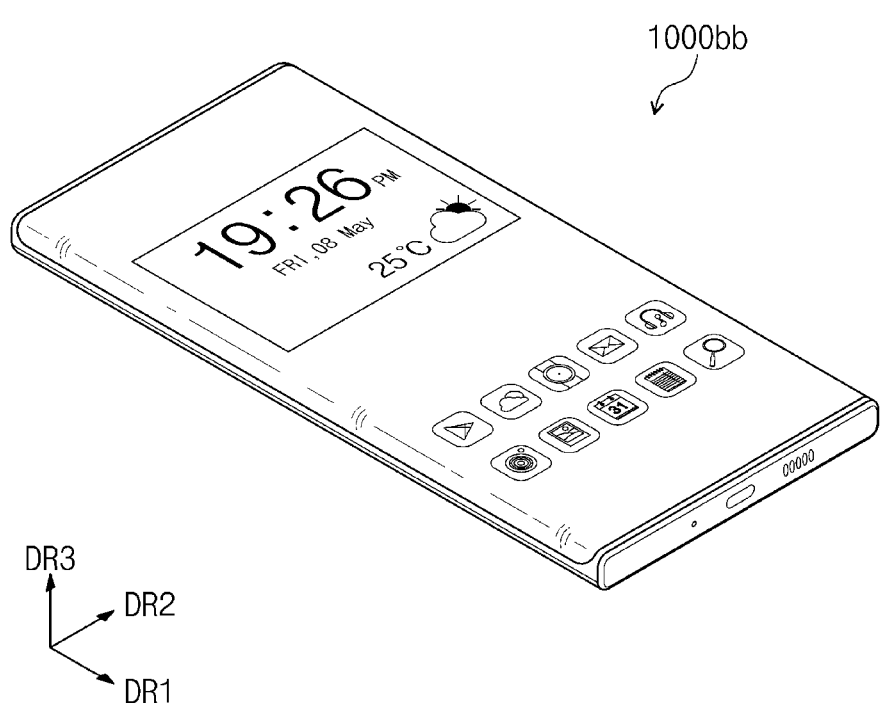
FIG. 10 is a schematic perspective view illustrating an electronic device according to an embodiment of the disclosure.
Figure 11:
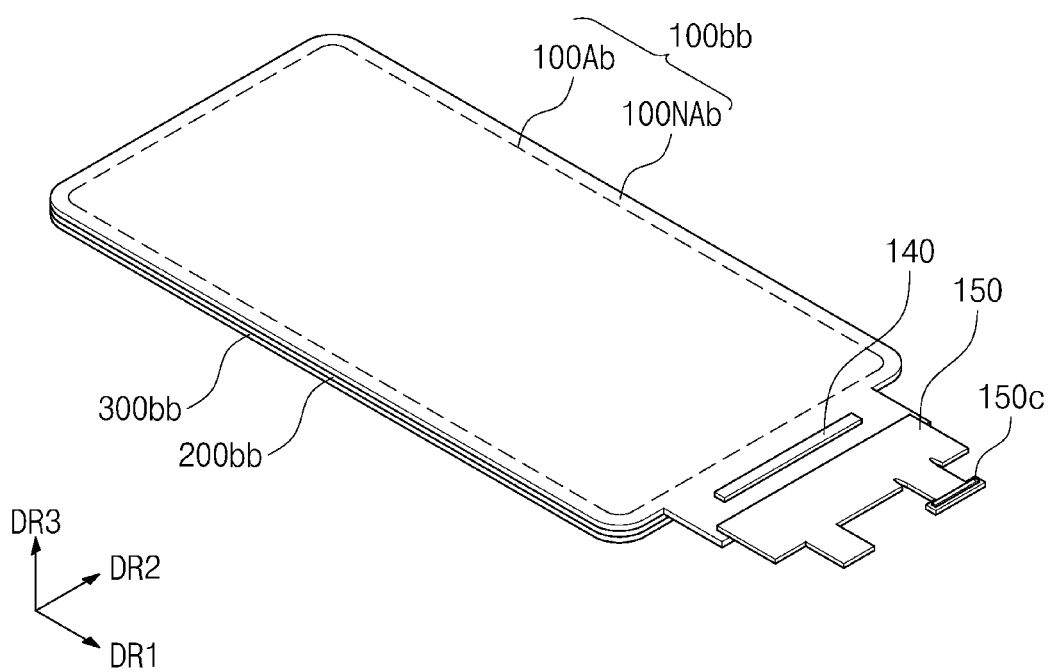
FIG. 11 is a schematic perspective view illustrating components of an electronic device according to an embodiment of the disclosure.
Figure 12:
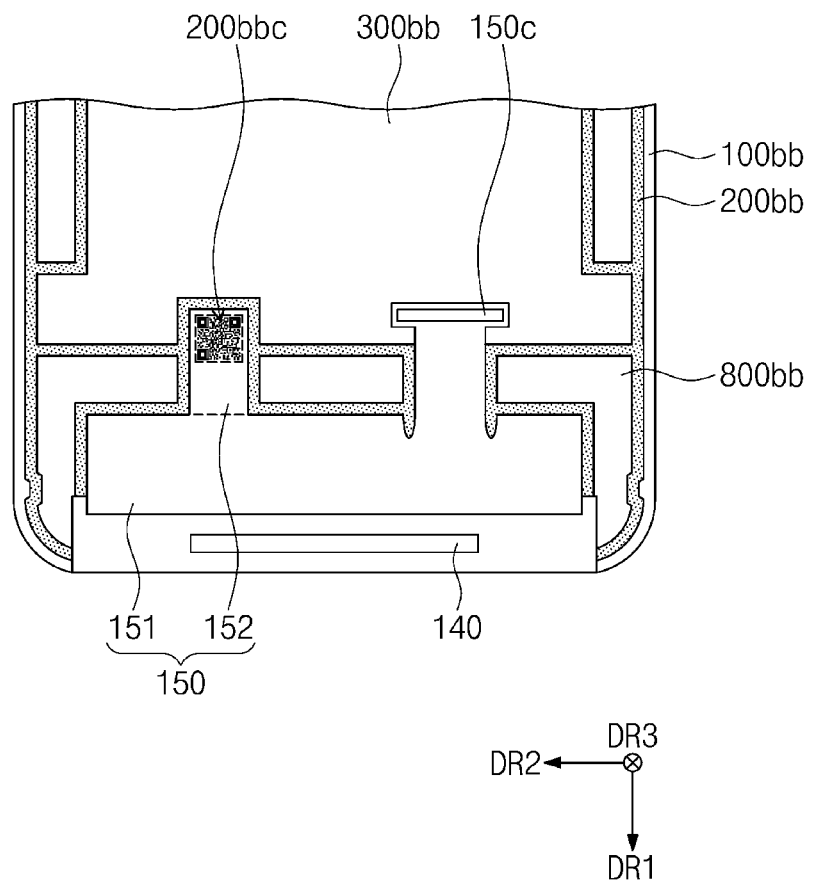
FIG. 12 is a schematic rear view illustrating components of an electronic device according to an embodiment of the disclosure.

FIG. 10 is a schematic perspective view illustrating an electronic device according to an embodiment of the disclosure. FIG. 11 is a schematic perspective view illustrating components of an electronic device according to an embodiment of the disclosure. FIG. 12 is a schematic rear view illustrating components of an electronic device according to an embodiment of the disclosure.

Referring to FIGS. 10, 11 and 12, an electronic device 1000*bb* may be a bar-type portable phone. In other words, a shape of the electronic device 1000*bb* may not be modified or changed, and the electronic device 1000*bb* may have a fixed shape.

The electronic device 1000*bb* may include a display panel 100*bb*, a driving chip 140, a circuit film 150, a plate 200*bb*, and a lower layer 300*bb*.

An active area 100Ab and a peripheral area 100NAb may be defined in the display panel 100*bb*. The driving chip 140 may be mounted on the peripheral area 100NAb of the display panel 100*bb*, and the circuit film 150 may be adhered to the peripheral area 100NAb of the display panel 100*bb*.

A portion of the peripheral area 100NAb of the display panel 100*bb* may be bent to be disposed on a rear surface of the display panel 100*bb*. For example, a portion of the peripheral area 100NAb of the display panel 100*bb*, to which the driving chip 140 and the circuit film 150 may be adhered, may be bent toward the rear surface of the display panel 100*bb*.

The plate 200*bb* may be adhered to the rear surface of the display panel 100*bb*. The display panel 100*bb* and the plate 200*bb* may be adhered to each other by an adhesive layer. However, embodiments of the disclosure are not limited thereto. In a certain embodiment, other functional layers may further be disposed between the plate 200*bb* and the display panel 100*bb*.

The plate 200*bb* may include a metal, a metal alloy, or a combination thereof. For example, the plate 200*bb* may include, but is not limited to, SUS304. A unique code 200*bbc* may be provided on a bottom surface of the plate 200*bb*. The unique code 200*bbc* may be engraved on the bottom surface of the plate 200*bb* by a laser. The bottom surface of the plate 200*bb* may mean a surface facing the lower layer 300*bb*.

The lower layer 300*bb* may be adhered to a rear surface (i.e., the bottom surface) of the plate 200*bb*. The lower layer 300*bb* and the plate 200*bb* may be adhered to each other by an adhesive layer. The lower layer 300*bb* may be a single layer or may include multiple stacked layers.

The lower layer 300*bb* may overlap only a portion of the plate 200*bb*. In particular, the lower layer 300*bb* may not overlap the unique code 200*bbc* provided on the plate 200*bb*.

Thus, an area of the plate 200*bb*, in which the unique code 200*bbc* is disposed, may not be covered by the lower layer 300*bb* but may be exposed.

A step-difference compensation member (or an adhesive member) 800*bb* may be adhered to the rear surface (or the bottom surface) of the plate 200*bb*. The step-difference compensation member 800*bb* may be an adhesive member having an adhesive property on both surfaces. The step-difference compensation member 800*bb* may be coupled to a set disposed under the lower layer 300*bb*.

According to an embodiment of the disclosure, the unique code 200*bbc* may be covered by the second portion 152 of the circuit film 150. The unique code 200*bbc* covered by the second portion 152 is illustrated in FIG. 12 for the purpose of ease and convenience in explanation. However, the unique code 200*bbc* may not be visible since it may be covered by the second portion 152.

According to an embodiment of the disclosure, the second portion 152 of the circuit film 150 may compensate a step difference between an area where the lower layer 300*bb* is disposed and an area where the lower layer 300*bb* is not disposed. Thus, durability on impact of the electronic device 1000*bb* may be improved by the second portion 152.

The area of the plate 200*bb*, in which the unique code 200*bbc* is disposed, may be covered by the circuit film 150 having insulating properties. Thus, the possibility that the plate 200*bb* is in contact with the set disposed under the lower layer 300*bb* may be reduced or removed. Electrical noise caused by contact of the plate 200*bb* and the set may be reduced or removed, and thus reliability of the electronic device 1000*bb* may be improved.

According to embodiments of the disclosure, an electronic device may include a display panel, and a plate disposed under the display panel and having a code area in which a unique code may be provided. The code area of the plate may be covered by a circuit film having insulating properties. Thus, the possibility that the code area of the plate is in contact with a set may be reduced or removed. As a result, reduction in touch sensitivity of the electronic device may be inhibited or prevented and the possibility of occurrence of noise may be reduced, and thus the reliability of the electronic device may be improved.

The circuit film may compensate a step difference between an area of the rear surface of the plate where the lower layers may be disposed and another area of the rear surface of the plate where the unique code is printed. Thus, durability on impact of the electronic device may be improved by the circuit film covering the code area.

While aspects have been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scope of the disclosure is to be determined by the broadest permissible interpretation of the following claims and their equivalents, and shall not be restricted or limited by the foregoing description.

What is claimed is:

1. An electronic device comprising:
    a display panel;
    a plate disposed under the display panel and including a code area in which a unique code is disposed; and
    a circuit film electrically connected to the display panel, the circuit film including:
        a first portion; and
        a second portion extending from the first portion and covering the code area.

2. The electronic device of claim 1, further comprising:
    a plurality of lower layers disposed on a bottom surface of the plate and exposing the code area.

3. The electronic device of claim 2, wherein a thickness of the second portion of the circuit film is equal to or less than a thickness of the plurality of lower layers.

4. The electronic device of claim 2, wherein a portion of the second portion is surrounded by the plurality of lower layers.

5. The electronic device of claim 1, wherein a thickness of the first portion of the circuit film is greater than a thickness of the second portion.

6. The electronic device of claim 1, wherein
    the display panel includes a first area, a second area and a third area;
    the first area, the second area, and the third area are disposed along a first direction;
    the second area is foldable along a folding axis extending in a second direction intersecting the first direction; and
    an opening is disposed in a portion of the plate, which faces the second area.

7. The electronic device of claim 6, further comprising:
    a cover layer disposed on a bottom surface of the plate and covering the opening;
    a plurality of lower plates disposed on a bottom surface of the cover layer and spaced apart from each other in the first direction;
    a plurality of heat dissipation sheets disposed on bottom surfaces of the plurality of lower plates, respectively; and
    a plurality of insulating films disposed on bottom surfaces of the plurality of heat dissipation sheets, respectively.

8. The electronic device of claim 7, wherein a thickness of the second portion of the circuit film is equal to or less than a height from the bottom surface of the plate to a bottom surface of each of the plurality of insulating films.

9. The electronic device of claim 6, wherein
    the code area is disposed under the third area, and
    the circuit film is disposed in a peripheral area of the display panel, the peripheral area being adjacent to the third area.

10. The electronic device of claim 1, further comprising:
    a conductive tape disposed between the first portion and the plate.

11. The electronic device of claim 10, wherein the conductive tape extends between the second portion of the circuit film and the plate.

12. The electronic device of claim 1, further comprising:
    an adhesive layer disposed between the second portion of the circuit film and the plate.

13. The electronic device of claim 1, wherein
    the plate includes at least one of a metal and a metal alloy, and
    the second portion of the circuit film includes an insulating material.

14. The electronic device of claim 1, wherein
    the second portion of the circuit film extends from the first portion in a first direction, and
    a width of the second portion in a second direction intersecting the first direction is less than a width of the first portion in the second direction.

15. An electronic device comprising:
    a display panel;
    a plate disposed under the display panel and having a bottom surface on which a unique code is disposed; and
    a circuit film electrically connected to the display panel and disposed on the bottom surface of the plate,
    wherein the circuit film includes:
        a first portion having a first thickness; and
        a second portion having a second thickness less than the first thickness and covering the unique code.

16. The electronic device of claim 15, further comprising:
    a plurality of lower layers disposed on the bottom surface of the plate and not overlapping the circuit film, the plurality of lower layers protruding from the bottom surface of the plate to a same level or a level lower than a bottom surface of the second portion of the circuit film.

17. The electronic device of claim 15, wherein
    the plate includes at least one of a metal and a metal alloy, and
    the second portion of the circuit film includes an insulating material.

18. An electronic device comprising:
    a display panel;
    a plate disposed under the display panel and including a bottom surface and a top surface disposed between the bottom surface and the display panel, the bottom surface including:
        a first area in which a unique code is disposed; and
        a second area adjacent to the first area;
    an insulating film disposed under the second area of the plate; and
    a circuit film including:
        a first portion disposed in the second area of the plate; and
        a second portion covering the first area.

19. The electronic device of claim 18, wherein a distance between the bottom surface of the plate and a bottommost surface of the insulating film is equal to or greater than a distance between the bottom surface of the plate and a bottom surface of the second portion of the circuit film.

* * * * *